(12) United States Patent
Kim

(10) Patent No.: US 7,623,193 B2
(45) Date of Patent: Nov. 24, 2009

(54) THIN FILM TRANSISTOR ARRAY PANEL USED FOR A LIQUID CRYSTAL DISPLAY AND A MANUFACTURING METHOD THEREOF

(75) Inventor: Dong-Gyu Kim, Kyungki-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 238 days.

(21) Appl. No.: 11/249,278

(22) Filed: Oct. 14, 2005

(65) Prior Publication Data

US 2006/0033102 A1 Feb. 16, 2006

Related U.S. Application Data

(60) Continuation of application No. 10/692,033, filed on Oct. 23, 2003, now Pat. No. 6,969,643, which is a continuation of application No. 09/156,525, filed on Sep. 17, 1998, now Pat. No. 6,682,961, which is a division of application No. 08/777,506, filed on Dec. 30, 1996, now Pat. No. 6,043,511.

(30) Foreign Application Priority Data

Dec. 29, 1995 (KR) ................................ 1995-66713

(51) Int. Cl.
    *G02F 1/136* (2006.01)
(52) U.S. Cl. ....................................................... 349/43
(58) Field of Classification Search ................... 349/43
    See application file for complete search history.

(56) References Cited

U.S. PATENT DOCUMENTS

| 4,759,610 A | 7/1988 | Yanagisawa | |
|---|---|---|---|
| 4,857,907 A * | 8/1989 | Koden | .......................... 349/140 |
| 5,032,531 A * | 7/1991 | Tsutsui et al. | .................. 438/30 |
| 5,279,980 A | 1/1994 | Hikichi et al. | ................. 437/40 |

(Continued)

FOREIGN PATENT DOCUMENTS

JP 62-223727 10/1987

(Continued)

OTHER PUBLICATIONS

Patent Abstracts of Japan, Publication No. 01-102525, Apr. 10, 1989, 1 p.

*Primary Examiner*—James A Dudek
(74) *Attorney, Agent, or Firm*—Innovation Counsel LLP

(57) ABSTRACT

An LCD includes an insulating substrate (30) with gate lines (32) and data lines (31) disposed thereon. The gate lines are parallel to each other and extend along a first direction, and the data lines are parallel to each other and extend along a second direction. The data lines cross the gate lines thereby defining a multiplicity of pixel regions (3). Each of the pixel regions includes a TFT (35), a pixel electrode (33) connected to the TFT, a common electrode (36) connected to a corresponding one of the data lines, and a dielectric layer (37) disposed between the common and pixel electrodes. The common electrode includes a plurality of protrusions (34). The protrusions, the dielectric layer, and the pixel electrode cooperatively define a storage capacitor (50) for holding the pixel region at a set voltage level until the next refresh cycle when the TFT is turned off.

14 Claims, 22 Drawing Sheets

U.S. PATENT DOCUMENTS

| | | | |
|---|---|---|---|
| 5,289,016 A | 2/1994 | Noguchi | 257/57 |
| 5,334,859 A | 8/1994 | Matsuda | 257/57 |
| 5,339,181 A | 8/1994 | Kim et al. | |
| 5,367,179 A | 11/1994 | Mori et al. | 257/59 |
| 5,483,082 A | 1/1996 | Takizawa et al. | 257/59 |
| 5,508,765 A | 4/1996 | Nakagawa et al. | 257/59 |
| 5,610,737 A | 3/1997 | Akiyama et al. | 349/47 |
| 5,621,556 A | 4/1997 | Fulks et al. | 349/42 |
| 5,621,566 A | 4/1997 | Fulks et al. | 349/42 |
| 5,648,674 A | 7/1997 | Weisfield et al. | 257/59 |
| 5,726,007 A | 3/1998 | Kawahata et al. | 438/30 |
| 5,737,049 A * | 4/1998 | Shin et al. | 349/122 |
| 5,818,551 A | 10/1998 | Park | 349/43 |
| 5,886,761 A * | 3/1999 | Sasaki et al. | 349/122 |

FOREIGN PATENT DOCUMENTS

| | | |
|---|---|---|
| JP | 62-240936 | 10/1987 |
| JP | 1-102525 | 4/1989 |
| JP | 1-156725 | 6/1989 |
| JP | 3-280019 | 12/1991 |
| JP | 4-318522 | 11/1992 |
| JP | 6-82830 | 3/1994 |
| JP | 6-208137 | 7/1994 |
| JP | 6-250210 | 9/1994 |
| JP | 7-84277 | 3/1995 |
| JP | 7-94747 | 4/1995 |
| JP | 6-202153 | 1/1996 |
| JP | 9-236827 | 3/2000 |

* cited by examiner

US 7,623,193 B2

THIN FILM TRANSISTOR ARRAY PANEL USED FOR A LIQUID CRYSTAL DISPLAY AND A MANUFACTURING METHOD THEREOF

CROSS REFERENCE TO PRIOR APPLICATIONS

This application is a Continuation Application of a U. S. patent application Ser. No. 10/692,033 filed on Oct. 23, 2003 and issued as U.S. Pat. No. 6,969,643, which is a continuation of U.S. patent application Ser. No. 09/156,525, filed Sep. 17, 1998 and issued as U.S. Pat. No. 6,682,961 on Jan. 27, 2004, which is a divisional of U.S. patent application Ser. No. 08/777,506, filed Dec. 30, 1996 and issued as U.S. Pat. No. 6,043,511 on Mar. 28, 2000, which claims priority to and the benefit of Korean Patent Application No. 1995-66713filed on Dec. 29, 1995, which are all hereby incorporated by reference for all purposes as if fully set forth herein.

BACKGROUND OF THE INVENTION

A. Field of the Invention

The present invention relates to a thin film transistor (TFT) array panel used for a liquid crystal display (LCD) and a fabricating method thereof. More particularly, the present invention relates to a method for manufacturing a TFT array panel through a photolithography process of four steps and a TFT array panel manufactured thereby.

B. Description of the Conventional Art

Generally, a liquid crystal display (LCD) includes two panels and liquid crystal material injected therebetween. Referring to FIG. 1, a wiring such as gate lines (not shown) and data lines (not shown), a pixel electrode 70 and a thin film transistor 70 are formed in either panel 100 of two panels. In addition, a black matrix 210, a color filter 220 and a common electrode 240 are formed in the other panel, and an overcoat film 230 is formed between the black matrix 210 and the color filter 220, and the common electrode 240.

Hereinafter, a conventional thin film transistor (TFT) array panel will be explained in detail with reference to FIGS. 2 and 3.

FIG. 2 is a plan view illustrating a conventional TFT array panel used for a liquid crystal display (LCD) and FIG. 3 is a cross-sectional view cut along the line III-III in FIG. 2.

As shown in FIG. 1 and FIG. 2, a gate line 11 and its branch, a gate electrode 12, are formed on a substrate 100. The gate line 11 and the gate electrode 12 are covered with a gate insulating layer 20. An amorphous silicon layer 30 and an $n^+$ amorphous silicon layer 40 are formed on the gate insulating layer 20. A pixel electrode 70 separated from the amorphous silicon layer 30 and the $n^+$ amorphous silicon layer 40 is formed on the gate insulating layer 20. A data line 51 and a source electrode 52, as well as a drain electrode 53, are formed thereon and the drain electrode 53 is connected to the pixel electrode 70. They are all covered with a passivation layer 61, except the pixel electrode 70. A light shielding film 62 is formed over the TFT which includes the amorphous silicon layer 30, the $n^+$ amorphous silicon layer 40, the gate electrode 12, and the source and the drain electrodes 12 and 13. The light shielding film 62 is made in order to prevent the leakage current in the amorphous silicon layer 30.

FIGS. 4A to 4G are plan views illustrating a manufacturing process of the conventional TFT array panel shown in FIGS. 2 and 3.

Referring to FIG. 4A, metal such as Cr, Al and Ta is deposited to a thickness of about 200 to 400 nm and patterned to form a gate line 11 and a gate electrode 12 through a photolithograph process using a first mask.

Referring to FIG. 4B, an insulating layer 20 of SiNx or $SiO_2$ is deposited to a thickness of about 300 to 400 nm, and an amorphous silicon layer 30 and an $n^+$ amorphous silicon layer 40 are deposited in sequence. The thickness of the amorphous silicon layer 30 is 200 nm and the thickness of the $n^+$ amorphous silicon layer 40 is 50 nm. Then, the amorphous silicon layer 30 and the $n^+$ amorphous silicon layer 40 are patterned in the same shape using a second mask.

Next, referring to FIG. 4C, an indium tin oxide (ITO) layer is deposited to a thickness of about 50 nm, and patterned to form a pixel electrode 70 through the photolithograph process using a third mask.

Referring to FIG. 4D, a conductive layer such as Cr, Ta or Ti is deposited to a thickness of about 150 to 300 nm, and patterned to form a data line 51 and a source and a drain electrodes 52 and 53 thorough the photolithography using a fourth mask.

Referring to FIG. 4E, the $n^+$ amorphous silicon layer 40 is etched to expose the amorphous silicon layer 30 on the gate electrode 12 using the data line 51 and a source and a drain electrodes 52 and 53 as a mask.

Referring to FIG. 4F, a passivation layer 61 of SiNx is deposited and patterned. The thickness of the passivation layer 61 is in the range from 200 to 400 µm, and the portion of the passivation layer 61 on the pixel electrode 70 is removed, using a fifth mask.

Referring to FIG. 4G, photoresist is deposited to the thickness of about 0.5 to 3 µm and patterned to form a light shielding film 62 on the TFT through the photolithography process, using a sixth mask.

As described above, six masks are required with the exception of a pad, when fabricating the conventional TFT array panel. Furthermore, more than six masks are needed when considering the pad portion. Accordingly, the conventional method has disadvantages in that the fabrication method is complex and the manufacturing cost is high.

SUMMARY OF THE INVENTION

Accordingly, an object of the present invention is to reduce the number of photolithography steps, thereby reducing manufacturing cost and improving the productivity.

After patterning a passivation film and a light shielding film or a passivation film also having a function of the light shielding film in the present invention, the number of mask is reduced by etching a semiconductor layer, using the patterned film as a mask.

This will be explained in detail hereinafter.

A gate line and a gate electrode are formed on a substrate, and a gate insulating layer and a semiconductor layer are deposited in sequence. A data line, a source electrode and a drain electrode are formed through a photolithography step, after depositing a metal layer. The passivation film and the light shielding film or a passivation film of opaque material are deposited in sequence and patterned through the photolithography step. Here, the passivation film covers over the data line, the source electrode and a part of the drain electrode. A pixel electrode is formed by depositing transparent conductive material and etching the transparent conductive material through the photolithography step, after etching the semiconductor layer, using the passivation film as the mask.

In the present invention, only four masks are required when fabricating a thin film transistor (TFT) array panel with the exception of a pad. The pattern of the semiconductor layer is the same as the passivation film except a portion under the drain electrode, which is not covered with the passivation film.

To fabricate a panel with four masks including the pad, a step for etching only the gate insulating layer for exposing the pad, should be omitted. For this, it is preferable that the pattern of the gate insulating layer should be the same as the semiconductor layer and the gate insulating layer is patterned, using the semiconductor layer as the mask. For this, the portions that the gate insulating layer should cover, that is, the gate line and the gate electrode are covered with the passivation film and the semiconductor layer, and the passivation film on the pad is etched to expose the pad when etching the passivation film.

Additional objects and advantages of the invention are set forth in part in the description which follows, and in part will be obvious from the description, or may be learned by practice of the invention. The objects and advantages of the invention will be realized and attained by means of the elements and combinations particularly pointed out in the appended claims.

BRIEF DESCRIPTION OF THE DRAWINGS

The accompanying drawings, illustrate three embodiments of the invention and, together with the description, serve to explain the principles of the invention.

In the drawings.

DETAILED DESCRIPTION OF THE PREFERRED EMBODIMENTS

Reference will now be made in detail to preferred embodiments of the present invention, examples of which are illustrated in the accompanying drawings.

Figure 5:
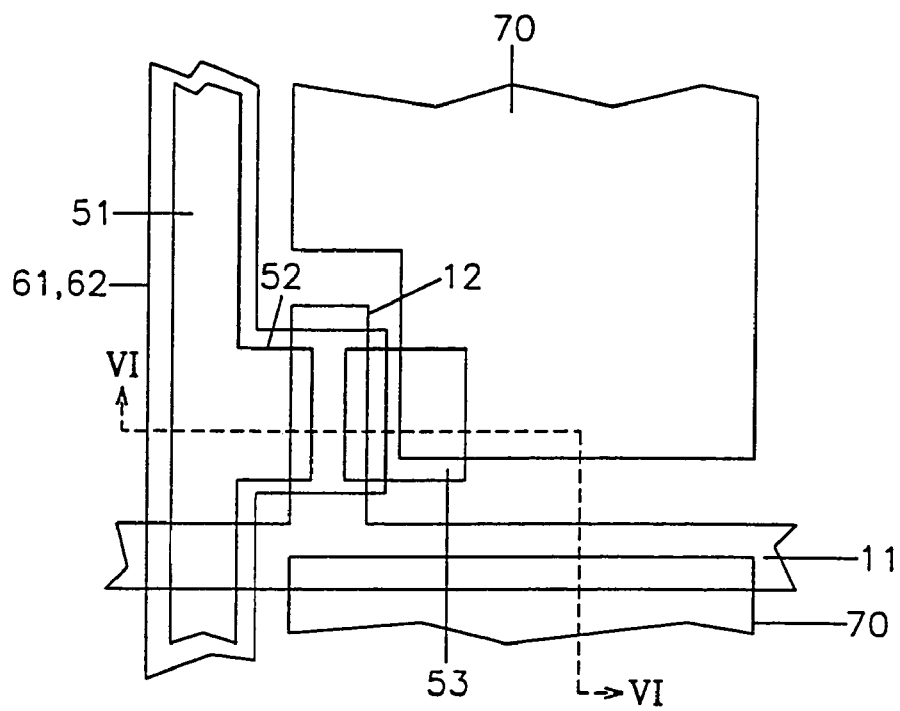
FIG. 5 is a plan view illustrating a TFT array panel used for an LCD in accordance with a first preferred embodiment of the present invention.
Figure 6:
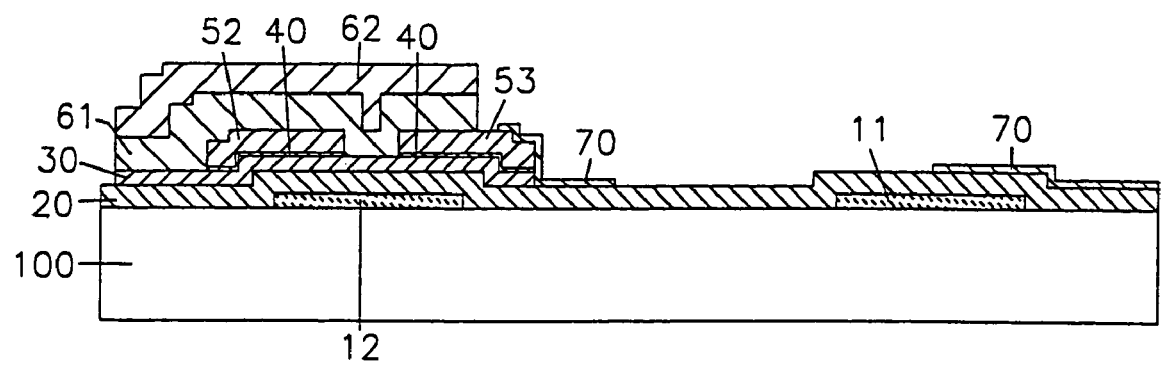
FIG. 6 is a cross-sectional view cut along the line VI-VI in FIG. 5.

FIG. 5 is a plan view illustrating a TFT array panel used for an LCD in accordance with a first preferred embodiment of the present invention and FIG. 6 is a cross-sectional view cut along the line VI-VI of FIG. 5.

As shown in FIGS. 5 and 6, a gate line 11 is formed horizontally on a substrate 100, and a branch vertically extended from the gate line 11, that is, a gate electrode 12, is formed on the substrate 100. The gate line 11 and the gate electrode 12 are covered with a gate insulating layer 20. A semiconductor layer of such as an amorphous silicon layer 30 and a doped semiconductor layer of such as an $n^+$ amorphous silicon layer 40 are formed on the gate insulating layer 20. A data line 51 and a source electrode 52, as well as a drain electrode 53, are formed thereon in the same shape as the $n^+$ amorphous silicon layer 40. Here, the data line 51 is formed vertically, the branch extended horizontally therefrom, the source electrode 52 overlaps a part of the gate electrode 12, and the drain electrode 53 is formed symmetrically with the source electrode 53 for the gate electrode 12. They are all covered with a passivation film 61 and a light shielding film 62 having the same pattern as the passivation film 61, and a part of the drain electrode 53 is exposed outward the passivation film 61 and the light shielding film 62. Here, the pattern of the amorphous silicon layer 30 is the same as the passivation film 61 and the light shielding film 62 except a portion under the drain electrode 53 exposed outward the passivation film 61 and the light shielding film 62, and the pattern of the amorphous silicon layer 30 in the portion under the exposed drain electrode 53 is the same as the drain electrode 53. On the other hand, the pixel electrode 70 is formed on the gate insulating layer 20 exposed outward the passivation film 61 pattern, and connected to the exposed drain electrode 53. In addition, the pixel electrode 70 overlaps the gate line 11 via the gate insulating layer 20, and this portion functions as a storage capacitor.

Here, the light shielding film 62 may be formed under the passivation film 61, and the passivation film 61 can be formed on the passivation film 61. In addition, a passivation film also having the function of the light shielding film may be formed, using opaque material of such as a black photoresist instead of forming the passivation film 61 and the light shielding film 62.

Figure 1:
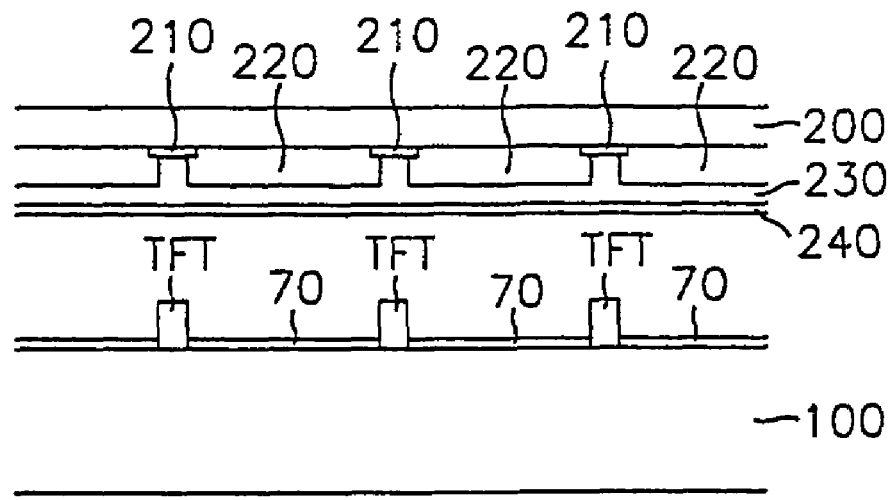
FIG. 1 is a cross-sectional view illustrating a conventional liquid crystal display.

Since the amorphous silicon layer 30 is covered with the drain electrode 53 made of the light shielding film 62 or opaque metal, the leakage current in the amorphous silicon layer 30 is reduced. In addition, since the width of the pattern of the light shielding film is wider than that of the data line 51, the source and the drain electrodes 52 and 53, short-circuit between the data line and a common electrode (reference numeral 240 in FIG. 1) of a opposite panel (reference numeral 200 in FIG. 1) hardly occurs.

FIGS. 7A to 7G are plan views illustrating a fabrication process of a TFT array panel shown in FIGS. 5 and 6, and FIGS. 8A to 8G are cross-sectional views cut along the line VIII-VIII in FIGS. 7A to 7G.

Figure 7A:
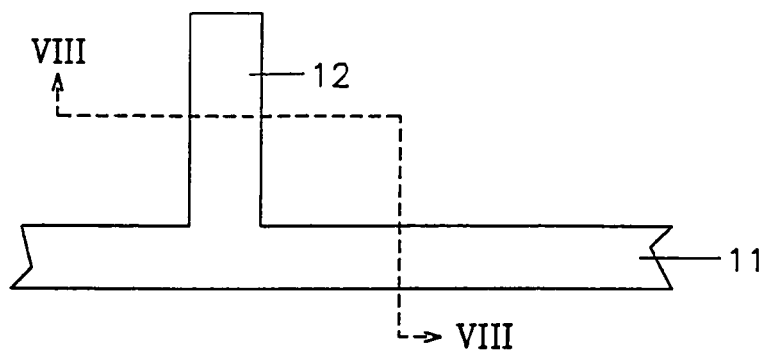
FIGS. 7A to 7G are plan views illustrating a fabrication process of a TFT array panel shown in FIGS. 5 and 6.
Figure 8A:
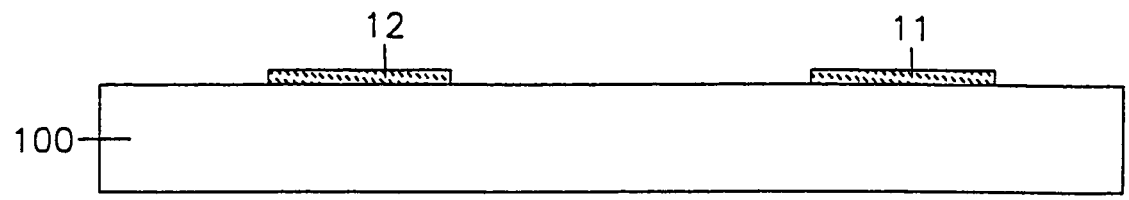
FIGS. 8A to 8G are cross-sectional views cut along the line VIII-VIII in FIGS. 7A to 7G.

Referring to FIGS. 7A and 8A, conductive material such as Cr, Al and Ta is deposited to a thickness of about 200 to 400 nm on a substrate 100 and patterned to form a gate line 11, a gate electrode 12 through a photolithography step, using a first mask. Here, the conductive material may be formed by a lower layer of Al or an alloy of Al—Nd and an upper layer of Mo, instead of the single layer. In addition, the conductive material may be formed by a lower layer of Cr and an upper layer of the alloy of Al—Nd.

Figure 7B:
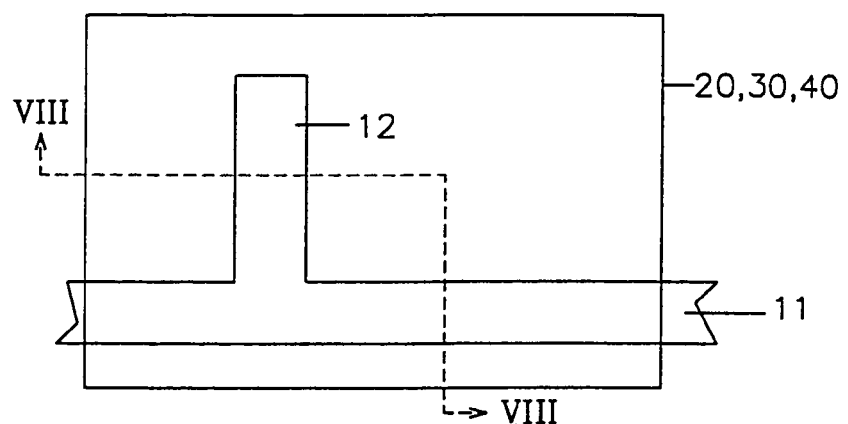
Figure 8B:
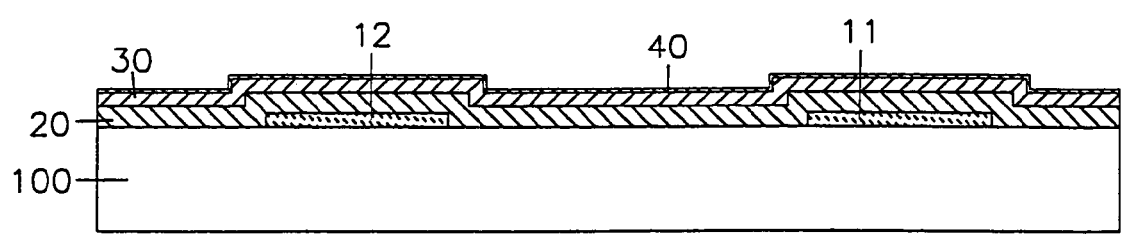

Referring to FIGS. 7B and 8B, an gate insulating layer 20 of such as SiNx and $SiO_2$ is deposited to a thickness of about 300 to 400 nm, and an amorphous silicon layer 30 and an $n^+$ amorphous silicon layer 40 are deposited in sequence thereon. The thickness of the amorphous silicon layer 30 is 200 nm and the thickness of the $n^+$ amorphous silicon layer 40 is 50 nm.

Figure 7C:
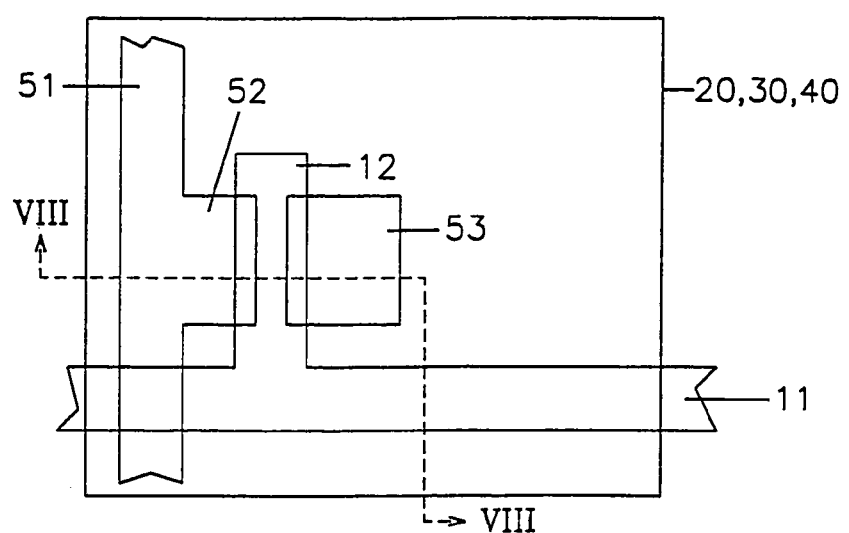
Figure 8C:
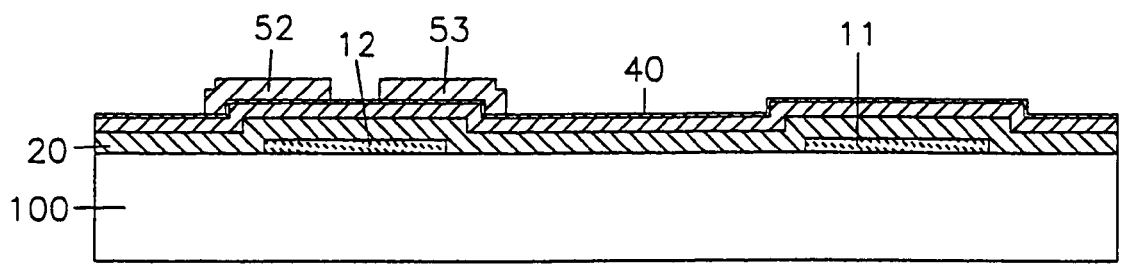

Next, referring to FIGS. 7C and 8C, a conductive layer of such as Cr, Ta or Ti is deposited to a thickness of about 150 to 300 nm, and patterned to form a data line 51, a source electrode 52 and a drain electrode 53 through the photolithography step, using a second mask.

Figure 7D:
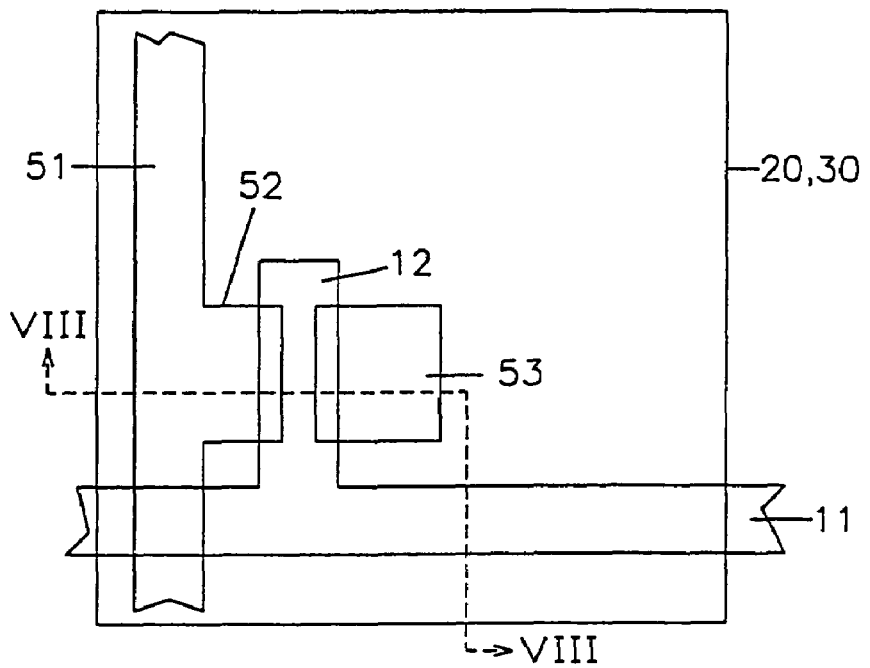
Figure 8D:
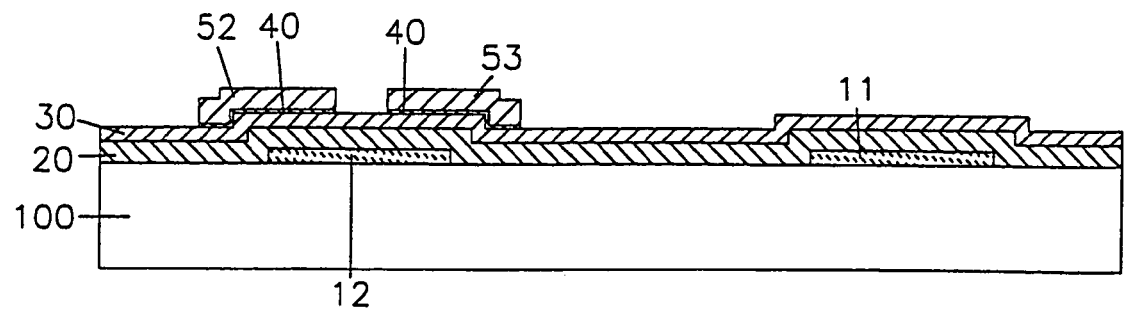

Referring to FIGS. 7D and 8D, the exposed n+ amorphous silicon layer 40 is etched, using the data line 51, the source electrode 52 and the drain electrode 53 as the mask.

Figure 7E:
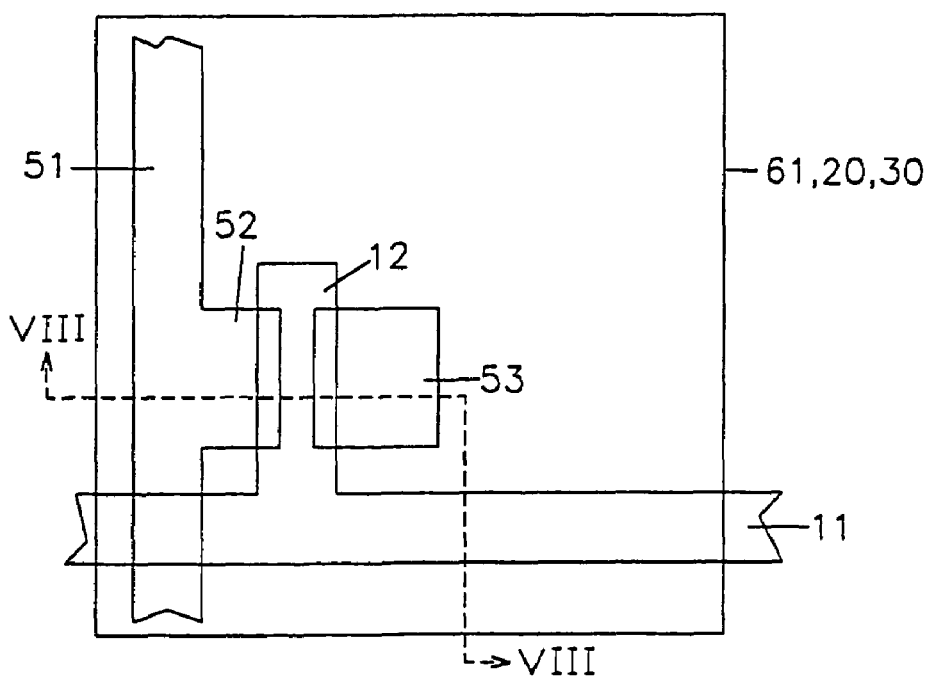
Figure 8E:
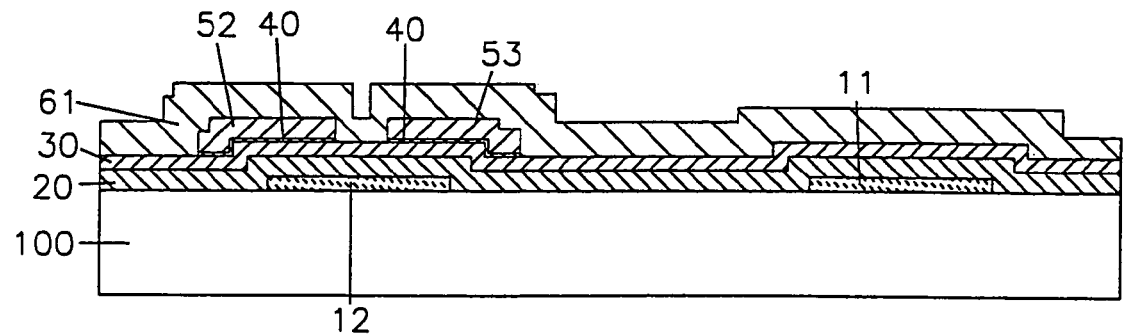

Referring to FIGS. 7E and 8E, the passivation film 61 of such as SiNx is deposited to the thickness of 200 to 400 μm.

Figure 7F:
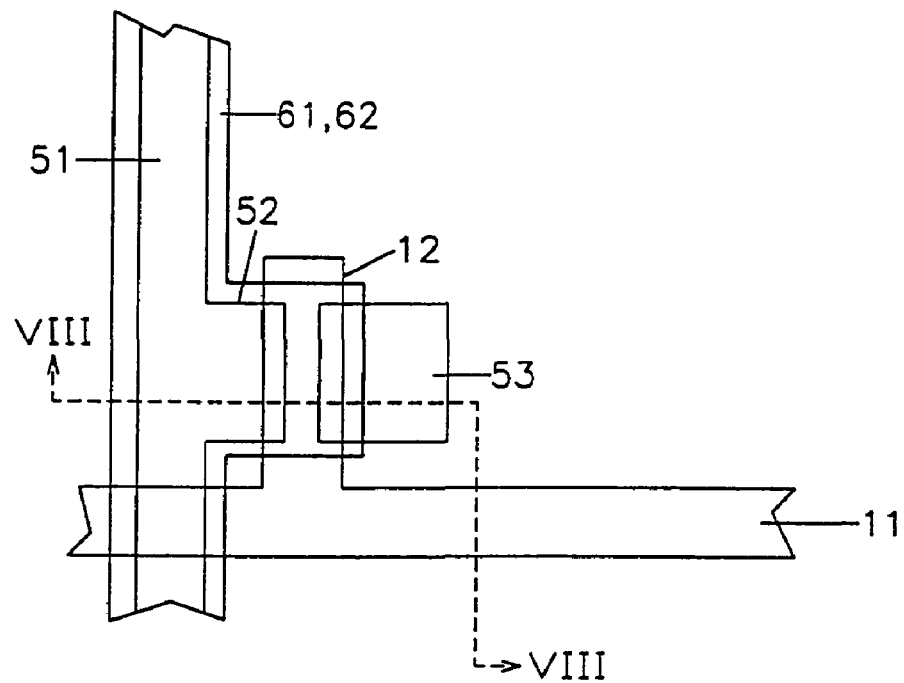
Figure 8F:
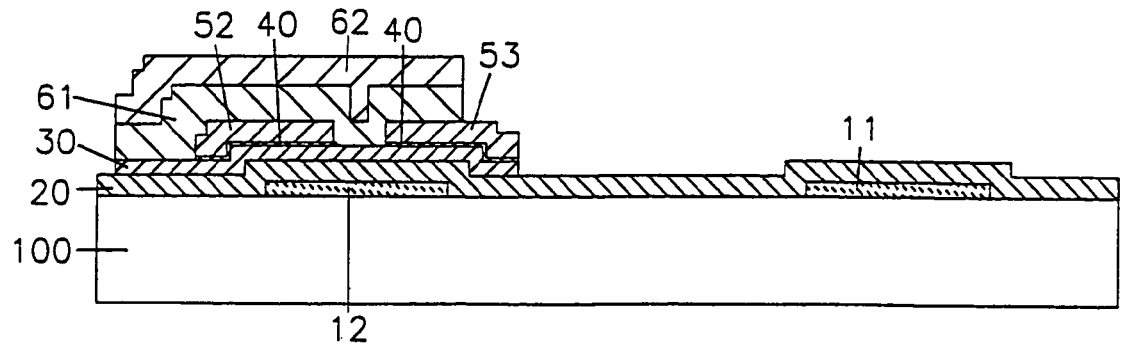

Referring to FIGS. 7F and 8F, photoresist is deposited to a thickness of about 0.5 to 3 μm, and patterned to form the light shielding film 62. And the passivation film 61 is etched, using the light shielding film 62 as the mask. In this process, the data line 51 and the source electrode 52 are covered with the light shielding film 62 and the passivation film 61, and a part of the drain electrode 53 is exposed. Then, the amorphous silicon layer 30 is etched, using the light shielding film 62 and the passivation film 61 and the exposed drain electrode 53 as the mask.

Here, the light shielding film 62 may be formed by a conductive material such as Cr.

Figure 7G:
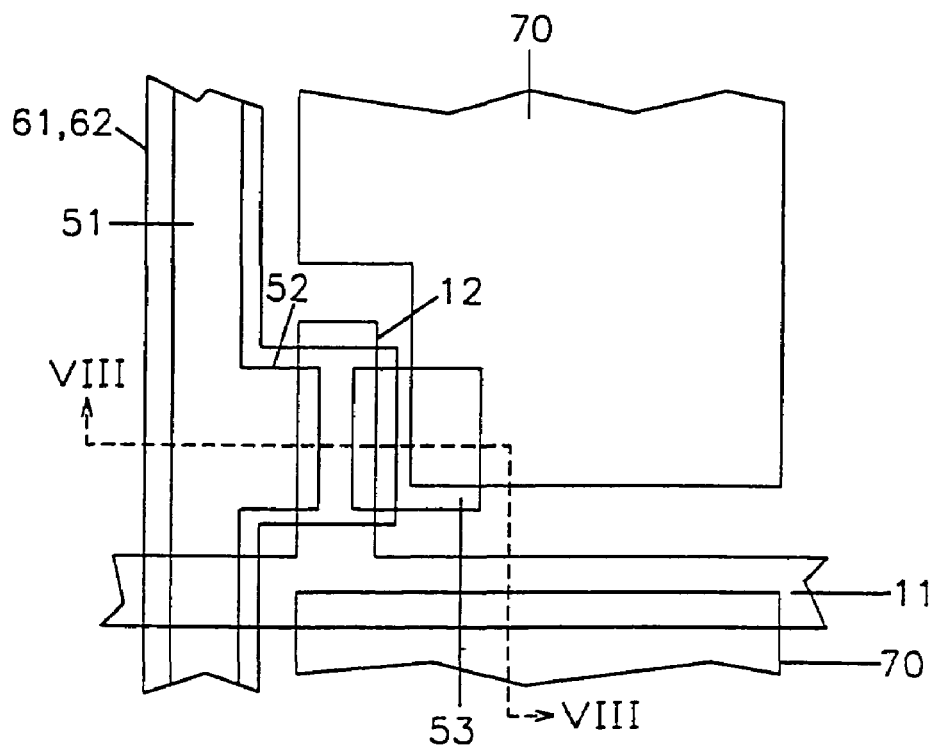
Figure 8G:
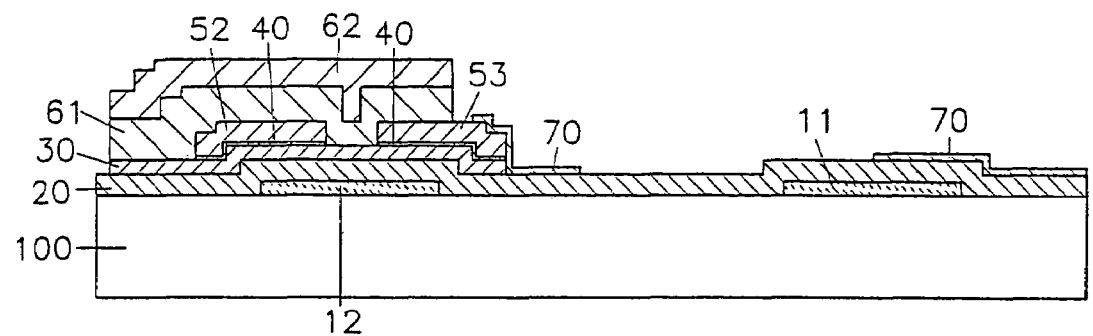

Finally, referring to FIGS. 7G and 8G, an indium tin oxide (ITO) layer is deposited to a thickness of about 50 nm, and patterned to form a pixel electrode 70 through the photolithography step, using a fourth mask.

As described above, the effect of the TFT array panel for an LCD in accordance with the first preferred embodiment of the present invention lies in that two masks are reduced, thereby reducing manufacturing cost and also increasing productivity by fabricating the TFT array panel using only four masks, compared to the conventional method.

A method for fabricating a panel including a pad using only four masks, and a structure fabricated thereby, are suggested in a second preferred embodiment of the present invention.

Figure 9:
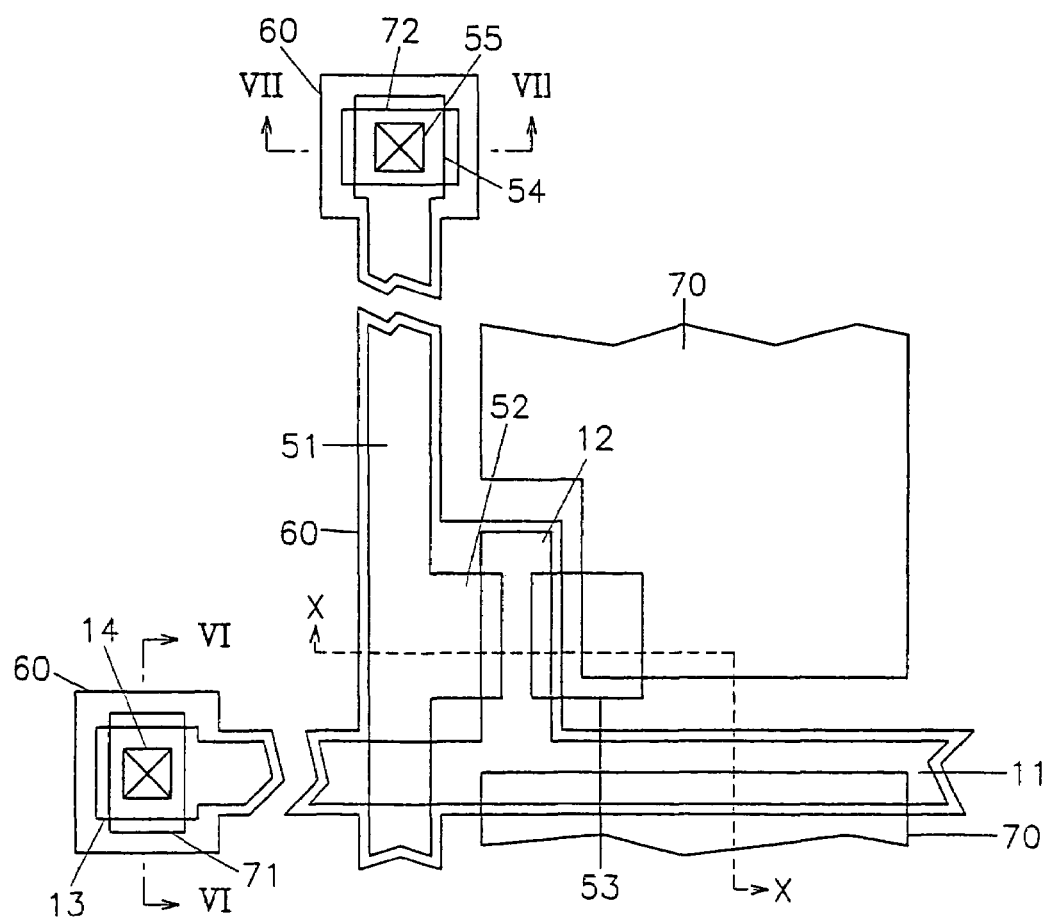
FIG. 9 is a plan view illustrating a TFT array panel used for an LCD in accordance with a second preferred embodiment of the present invention.

FIG. 9 is a plan view illustrating a TFT array panel used for an LCD in accordance with the second preferred embodiment of the present invention, and FIG. 9 illustrates also a gate pad and a data pad.

The main difference between the first preferred embodiment and the second preferred embodiment lies in that the gate insulating layer 20 has the same pattern as the amorphous silicon layer 30. Of course, likewise the first preferred embodiment of the present invention, the pattern of the amorphous silicon layer 30 is the same as the passivation film 60 also having the function of the light shielding film except for a portion under the drain electrode 53 exposed outward the passivation film 60 having the light shielding film, and the pattern of the amorphous silicon layer 30 in the portion under the exposed drain electrode 53 is the same as the drain electrode 53.

On the other hand, since the gate insulating layer 20 should cover the gate line 11, the gate electrode 12 and the gate pad 13, the pattern of the passivation film 60, the amorphous silicon layer 30 and the gate insulating layer 20 is formed on the gate line 11, the gate electrode 12 and the gate pad 13, except on the data line 51 and the source electrode 52, and a part of the drain electrode 53.

In addition, the passivation film 60, the amorphous silicon layer 30 and the gate insulating layer 20 have contact holes 14 and 15 on the gate pad 13 and a data pad 54 since the gate pad 13 and the data pad 54 are electronically connected to the outside and exposed to the outside. Here, a gate ITO pad 71 and a data ITO pad 72 connected respectively to the gate pad 13 and the data pad 54 through the contact holes 14 and 15 are formed to prevent oxidization which occurs when the gate pad 13 and the data pad 54 are directly exposed to the outside. Besides these, the differences between the first and the second preferred embodiments of the present invention lie in that the gate line 11, the gate electrode 12 and the gate pad 13 are formed in two layers respectively, and one layer of the passivation layer 60 of the black photoresist, also having the function of the light shielding film, is added. These layers may be formed in a single layer or in two layers.

The structure in FIG. 9 will be explained in detail.

Figure 10:
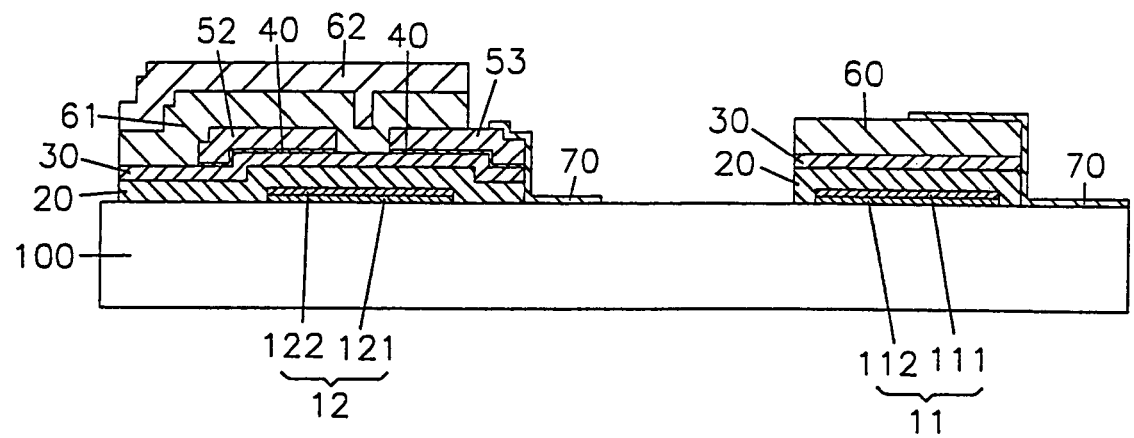
FIG. 10 is a cross-sectional view cut along the line X-X in FIG. 9.

FIG. 10 is a cross-sectional view cut along the line X-X in FIG. 9.

Referring to FIG. 10, the gate line 11 and the gate electrode 12 are made of respectively lower layers 111 and 121 and upper layers 112 and 122. The pattern of the gate insulating layer 20 is the same as the amorphous silicon layer 30. On the other hand, the gate insulating layer 20, the amorphous silicon layer 30 and the passivation film 60 cover the gate line 11 of two layers, and a pixel electrode 100 overlaps thereon.

The sections of the gate pad 13 and the data pad 54 will be explained.

Figure 11:
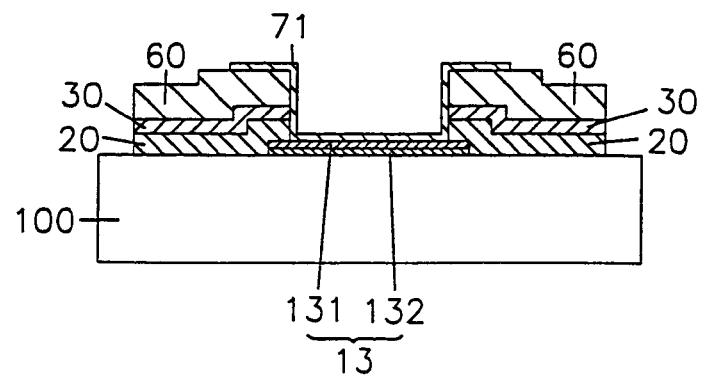
FIG. 11 is a cross-sectional view cut along the line XI-XI in FIG. 9.

FIG. 11 is a cross-sectional view cut along the line XI-XI in FIG. 9.

Referring to FIG. 11, the gate pad 13 is formed by a lower layer 131 and an upper layer 132, and the gate pad 13 is exposed by the contact hole 14 formed on the gate insulating layer 20, the amorphous silicon layer 30 and the passivation film 60. In addition, the upper layer 132 of the gate pad 13 is covered with the gate ITO pad 71.

Figure 12:
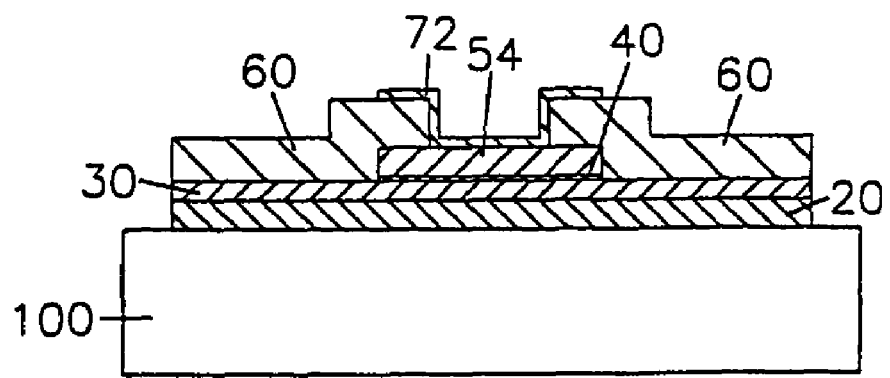
FIG. 12 is a cross-sectional view cut along the line XII-XII in FIG. 9.
Figure 2:
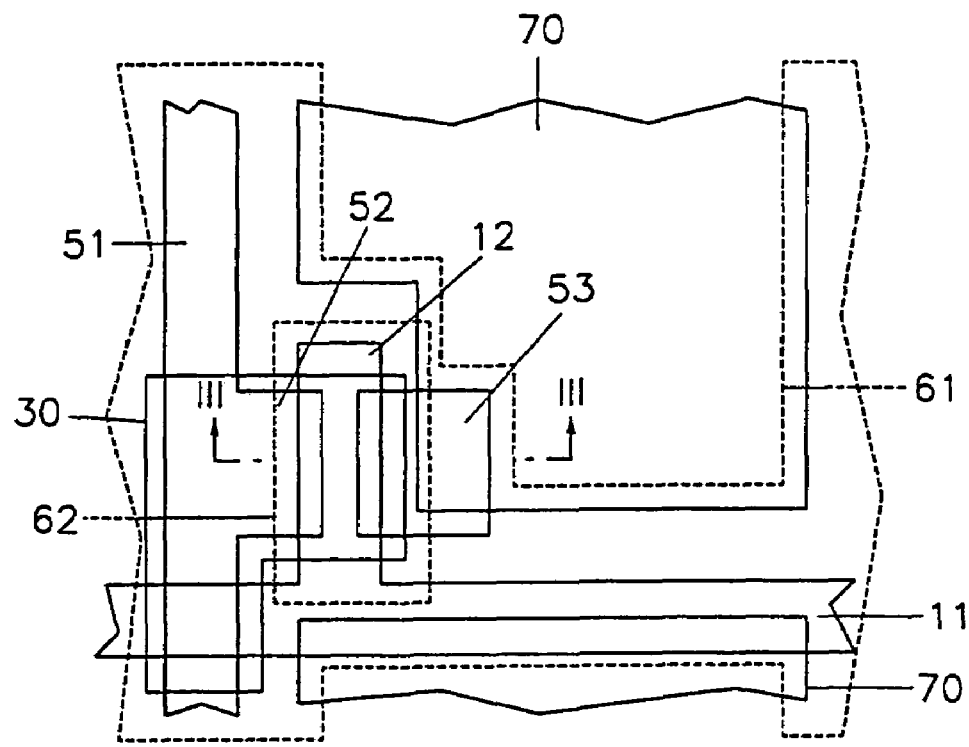
FIG. 2 is a plan view illustrating a conventional TFT array panel used for an LCD.
Figure 3:
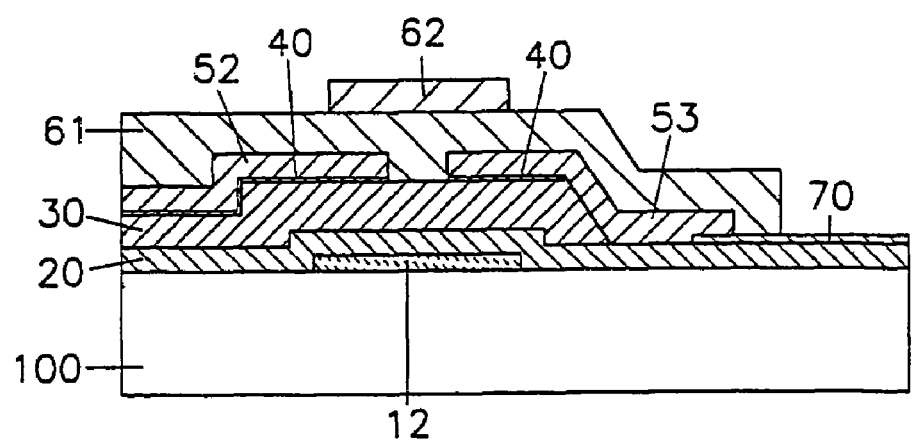
FIG. 3 is a cross-sectional view cut along the line III-III in FIG. 2.
Figure 4A:
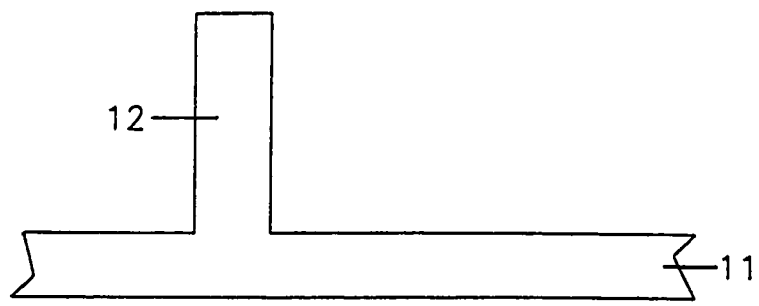
FIGS. 4A to 4G are plan views illustrating a manufacturing process of the conventional TFT array panel shown in FIGS. 2 and 3.
Figure 4B:
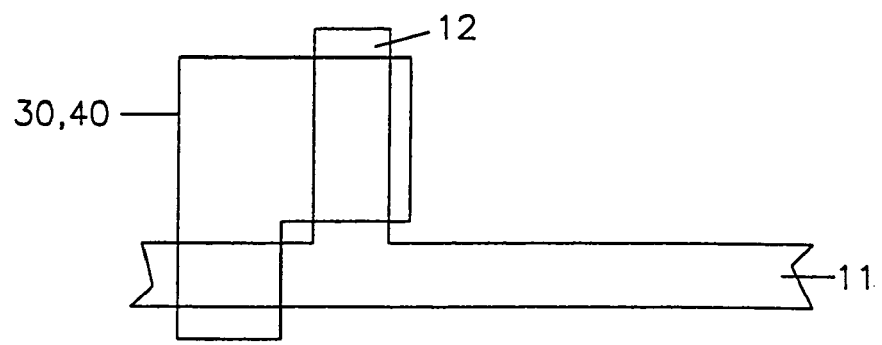
Figure 4C:
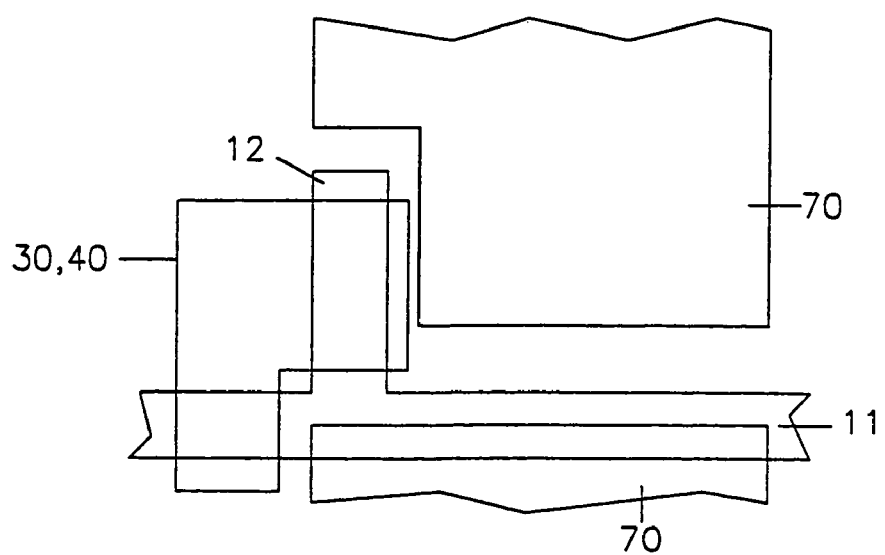
Figure 4D:
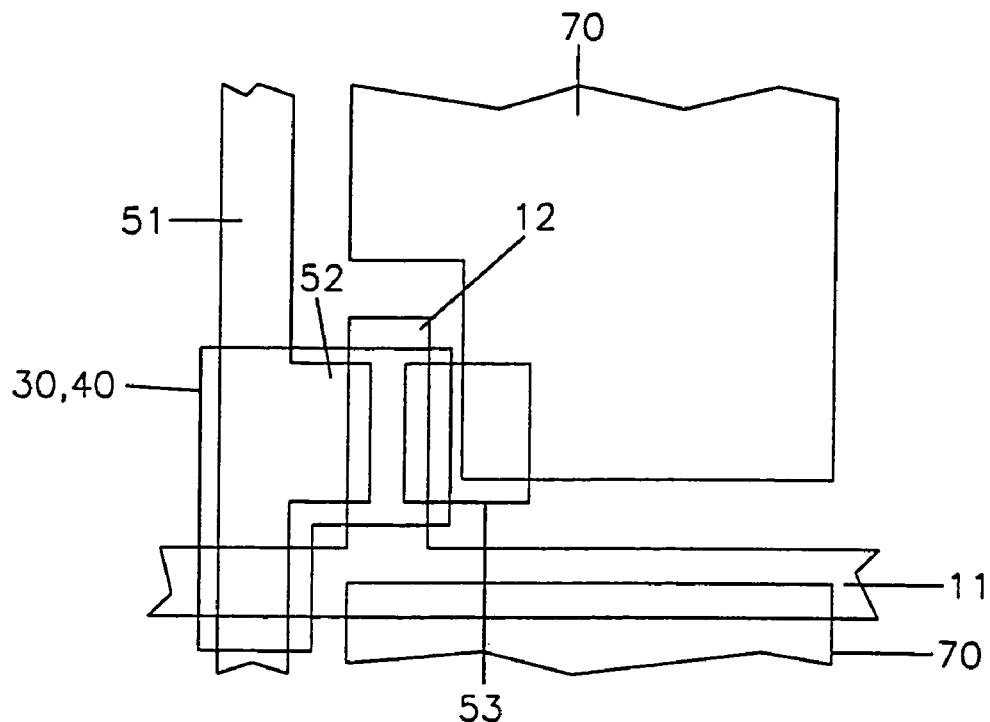
Figure 4E:
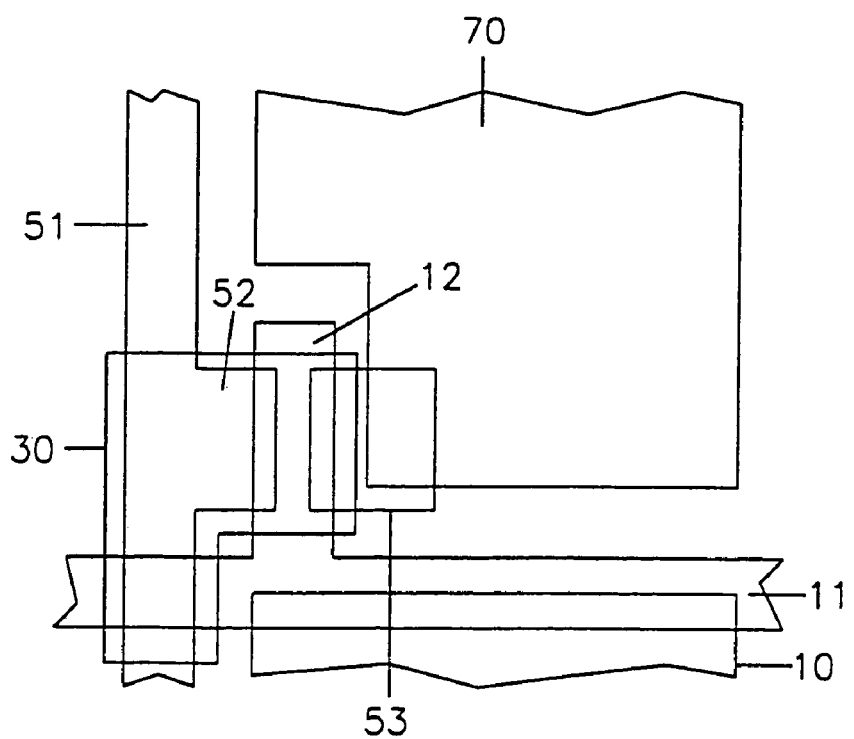
Figure 4F:
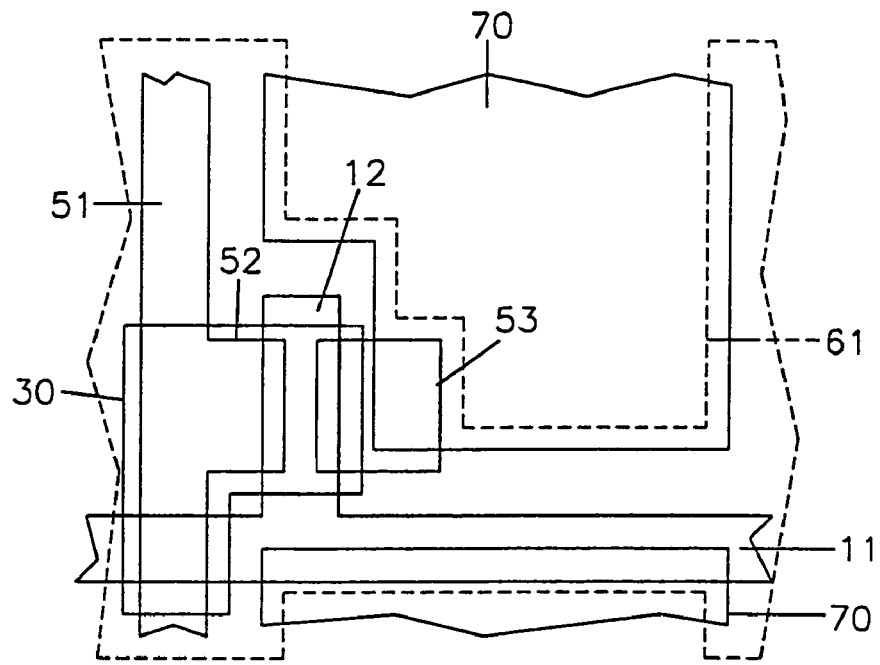
Figure 4G:
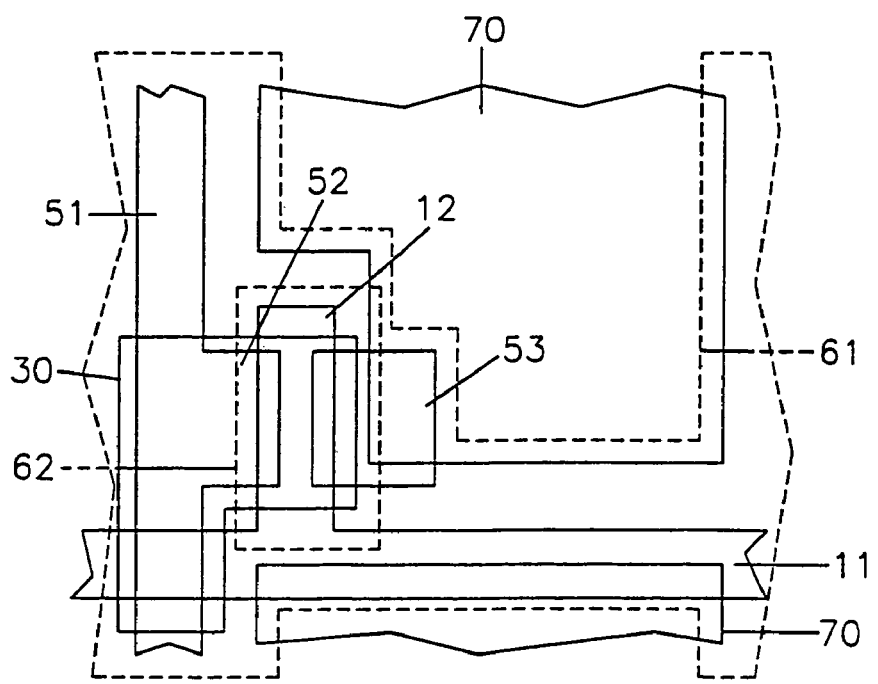

FIG. 12 is a cross-sectional view cut along the line XII-XII in FIG. 9.

Referring to FIG. 12, the gate insulating layer 20, the amorphous silicon layer 30 on the gate insulating layer 20, an $n^+$ amorphous silicon layer 40 on the amorphous silicon layer 30, and the data pad 54 on the $n^+$ amorphous silicon layer 40 are formed in the same pattern, and are connected to the ITO pad 72 through the contact hole formed in the passivation film 60 which covers the above pattern.

Figure 13A:
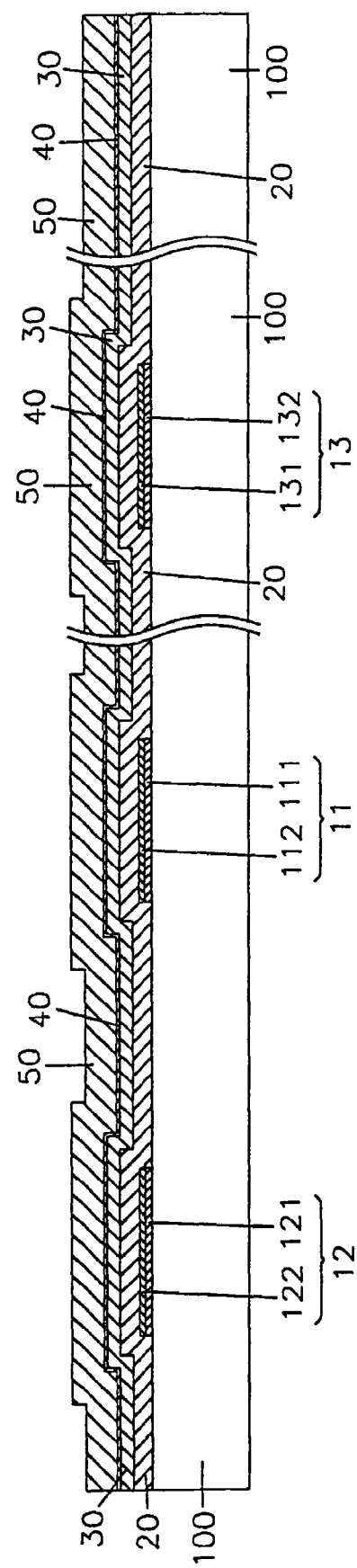
FIGS. 13A to 13C are plan views illustrating a fabrication process of a TFT array panel shown in FIGS. 9 to 12.
Figure 13B:
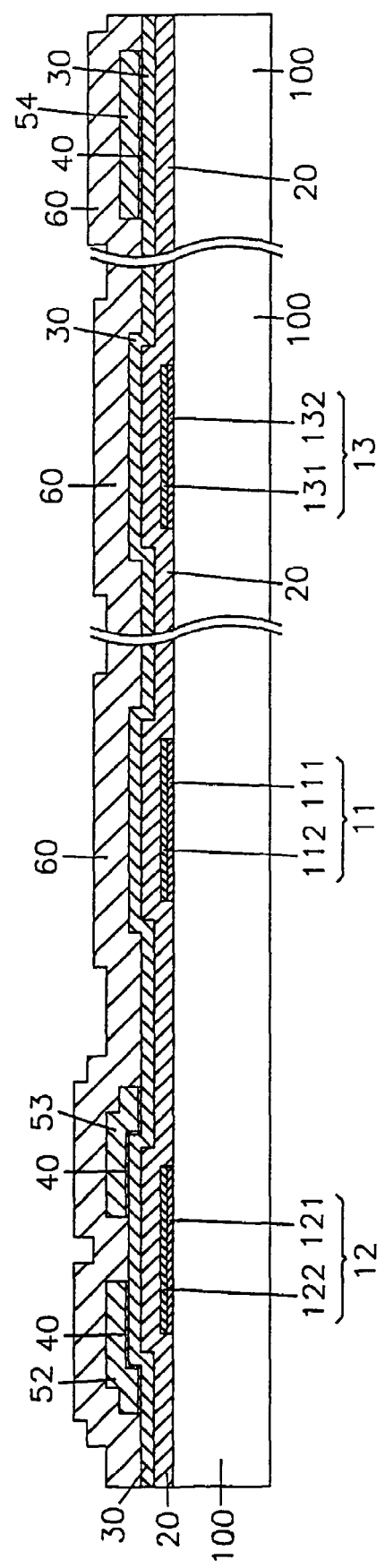
Figure 13C:
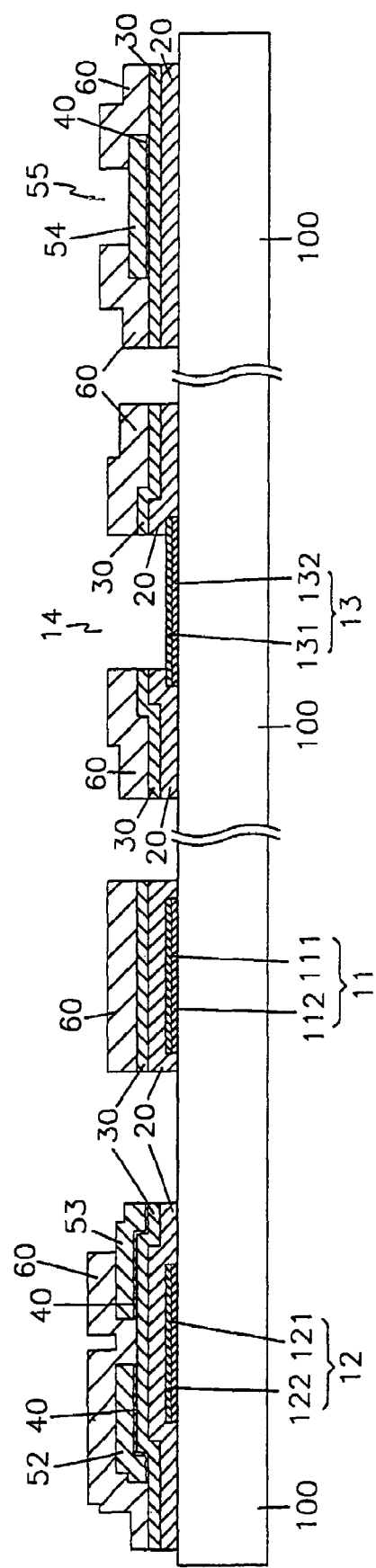

The above-mentioned TFT array panel in accordance with the second preferred embodiment of the present invention is formed primarily in the same way as the first preferred embodiment of the present invention. FIGS. 13A to 13C are plan views illustrating a fabrication process of a TFT array panel shown in FIGS. 9 to 12. The left portions in FIGS. 13A to 13C correspond to the TFT and the gate line in FIG. 10, central portions correspond to the gate pad in FIG. 11, and the right portions correspond to the data pad in FIG. 12.

First, referring to FIG. 13A, two layers of metal are deposited in sequence, and patterned to form the gate line 11, the gate electrode 12 and the gate pad 13, using a first mask. The lower layer and the upper layer may be formed by AL-Nd and Mo, or Cr and Al—Nd. In the second preferred embodiment of the present invention, the lower layer and the upper layer is formed by AL-Nd and Mo. Next, the gate insulating layer 20, the amorphous silicon layer 30, the n+ amorphous silicon layer 40 and a metal layer 50 are deposited in sequence.

FIG. 13B, the metal layer 50 is patterned to form the data line 51, the source electrode 52, the drain electrode 53 and the data pad 54, using a second mask. The n+ amorphous silicon layer 40 is etched, using the patterned data line 51, the source electrode 52, the drain electrode 53 and the data pad 54 as the mask. After that, the passivation film 60 is deposited.

Referring to FIG. 13C, the passivation film 60 is patterned, using a third mask. Here, the passivation film 60 covers the gate line 11, the gate electrode 12, the gate pad 13, the data line 51, the source electrode 52, the drain electrode 53 and the data pad 54. The contact holes 14 and 55 are formed on central portions of each pad 103 and 114, and an upper portion of a part of the drain electrode 53 is removed. The amorphous silicon layer 30 and the gate insulating layer 20 are etched in sequence, using the patterned passivation film 60 as the mask. Here, the amorphous silicon layer 30 and the gate insulating layer 20 under the drain electrode 53 are not etched.

Finally, the ITO film is deposited and patterned to form the pixel electrode 70, the gate ITO pad 71 and the data ITO pad 72, using a fourth mask, as illustrated in FIGS. 10, 11 and 12.

In the second preferred embodiment of the present invention, the pixel electrode 70 can be defective since the height difference in a portion in which the pixel electrode 70 overlaps the gate line 11, is large, as illustrated in FIG. 10.

A third preferred embodiment of the present invention suggests a structure which can reduce the height difference in the portion in which the pixel electrode 70 overlaps the gate line 11.

Figure 14:
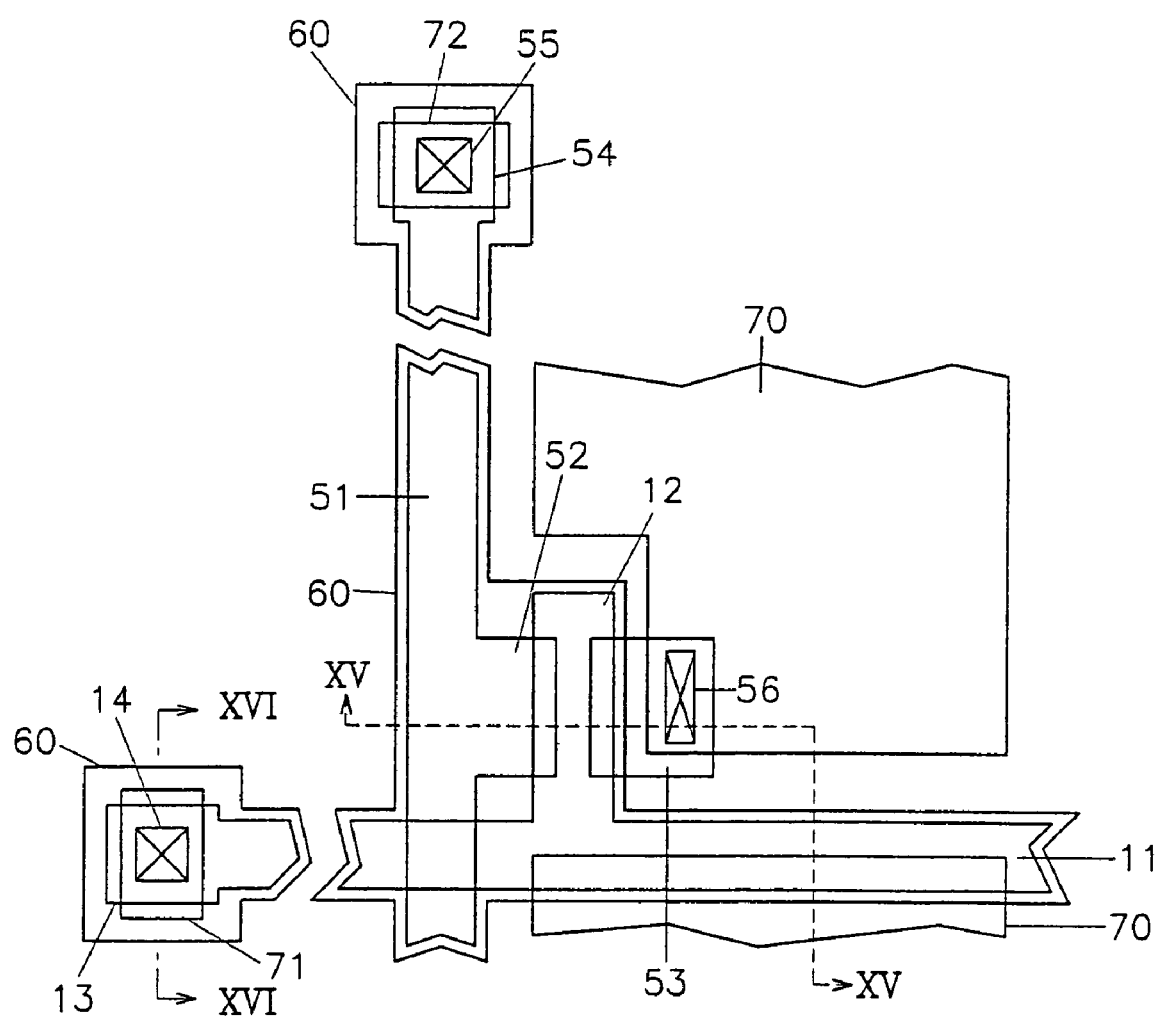
FIG. 14 is a plan view illustrating a TFT array panel used for an LCD in accordance with a third preferred embodiment of the present invention.
Figure 15:
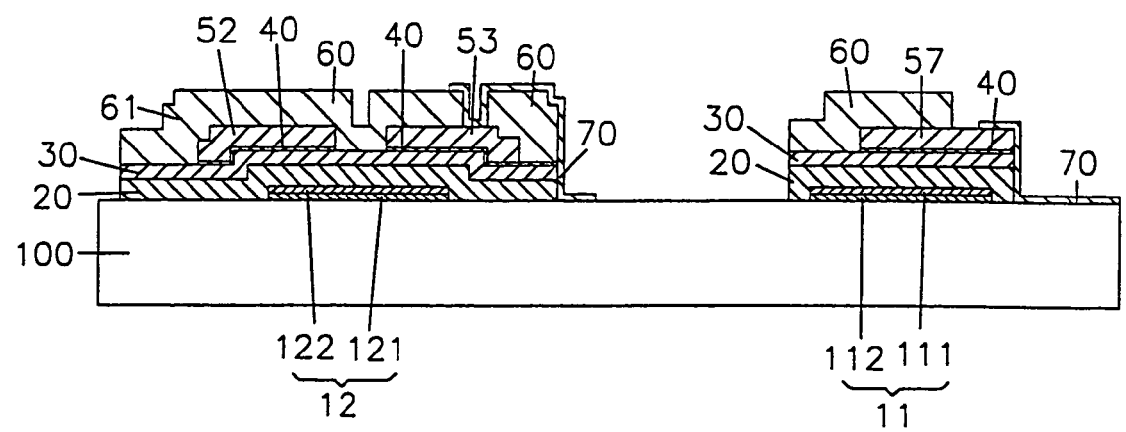
FIG. 15 is a cross-sectional view cut along the line XV-XV in FIG. 14.

FIG. 14 is a plan view illustrating a TFT array panel used for an LCD in accordance with a third preferred embodiment of the present invention, and FIG. 15 is a cross-sectional view cut along the line XV-XV in FIG. 14.

Referring to FIG. 14, the passivation film 60, which is made of opaque material and also serves as the light shielding function covers even the drain electrode 53 completely. Instead, the passivation film 60 has a contact hole 56 exposing the drain electrode 53, and the pixel electrode 70 contacts the drain electrode 53 through the contact hole 56.

In addition, the structure in FIG. 14 has the effects that storage capacitance is formed through the connection portion and the height difference of the pixel electrode 70 is reduced by forming a connection portion made of the same material as the data line 51, instead that the gate line 11 directly overlaps the pixel electrode 70. That is, referring to FIG. 15, the n+ amorphous silicon layer 40 and a connection portion 57 are formed, overlapping the gate line 11 on the amorphous silicon layer 30 formed on the gate line 11. The connection portion 57 is exposed outside the passivation film 60 and connected to the pixel electrode 70. The passivation film 60 in this portion is formed in the same way as the first and the second preferred embodiments of the present invention, the insulating layer 20 and the amorphous silicon layer 30 under the passivation film 60 are formed a little different from the passivation film 60 since the insulating layer 20 and the amorphous silicon layer 30 are formed even under the connection portion 57 exposed outside the passivation film 60. On the other hand, the pixel electrode 70 has the height difference from the upper portion of the connection portion 57 to the substrate 100, and compared to the second preferred embodiment of the present invention, this is the reduced height difference, considering that the passivation film 60 is thicker than the n+ amorphous silicon layer 40 and the connection portion 57.

On the other hand, the structure of the data pad 54 in accordance with the third preferred embodiment of the present invention is the same as the first preferred embodiment of the present invention, but the structure of the gate pad 13 is a little different from that in accordance with the first preferred embodiment of the present. The structure of the gate pad 13 in accordance with the third preferred embodiment of the present invention will be explained hereinafter.

Figure 16:
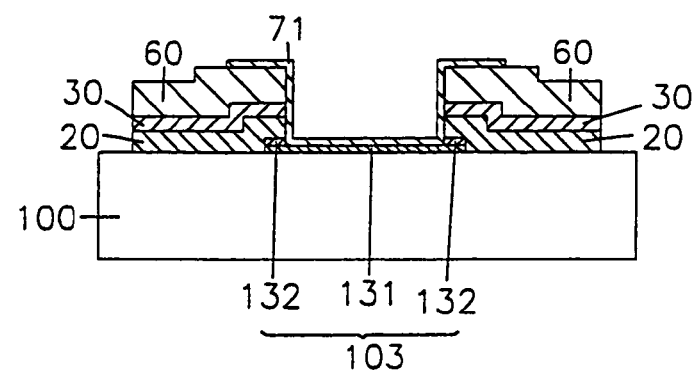
FIG. 16 is a cross-sectional view cut along the line XVI-XVI in FIG. 14.

FIG. 16 is a cross-sectional view cut along the line XVI-XVI in FIG. 14.

Referring to FIG. 16, the gate pad 13 are formed by a lower layer 131 and an upper layer 132, but the gate pad 13 is exposed through a contact hole 55 formed in the passivation film 60, the amorphous silicon layer 30 and the gate insulating layer 20, and an upper layer 132 of a portion contacting a gate ITO pad 71 is etched. This is why the lower layer 131 is made of Cr and the upper layer 132 is made of alloy of Al—Nd in the third preferred embodiment of the present invention. The gate ITO pad should cover the Al or the alloy of Al—Nd since Al or the alloy is easy to be oxidized and rust, but the upper layer 132 is etched since the ITO and the Al alloy do not contact each other well and an oxidation film is formed on a surface, whereby resistance becomes large.

Hereinafter, a fabrication process of a TFT array panel in accordance with the third preferred embodiment of the present invention will be explained with reference to FIGS. 17A to 17C. Here, the left portions in FIGS. 17A to 17C correspond to the TFT and the gate line in FIG. 15, central portions in FIGS. 17A to 17C correspond to the gate pad in FIG. 16, and the right portions in FIGS. 17A to 17C correspond to the data pad in FIG. 12.

Figure 17A:
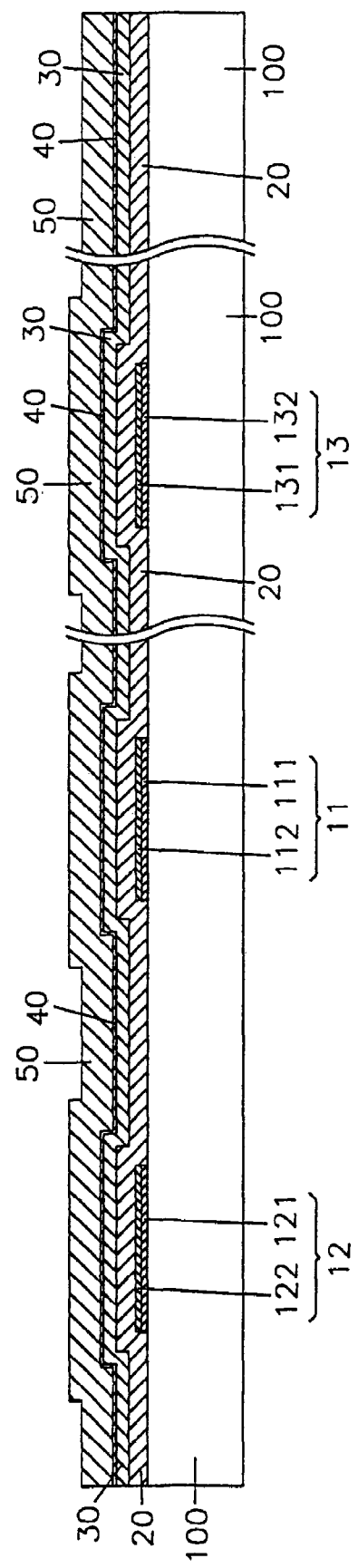
FIGS. 17A to 17C are plan views illustrating a fabrication process of a TFT array panel shown in FIGS. 14 to 16.

First, referring to FIG. 17A, two layers of metal are deposited in sequence, and patterned to form the gate line 11, the gate electrode 12 and the gate pad 13, using a first mask. The lower layer and the upper layer is formed by Cr and Al—Nd. Next, the gate insulating layer 20, the amorphous silicon layer 30, the n+ amorphous silicon layer 40 and a metal layer 50 are deposited in sequence.

Figure 17B:
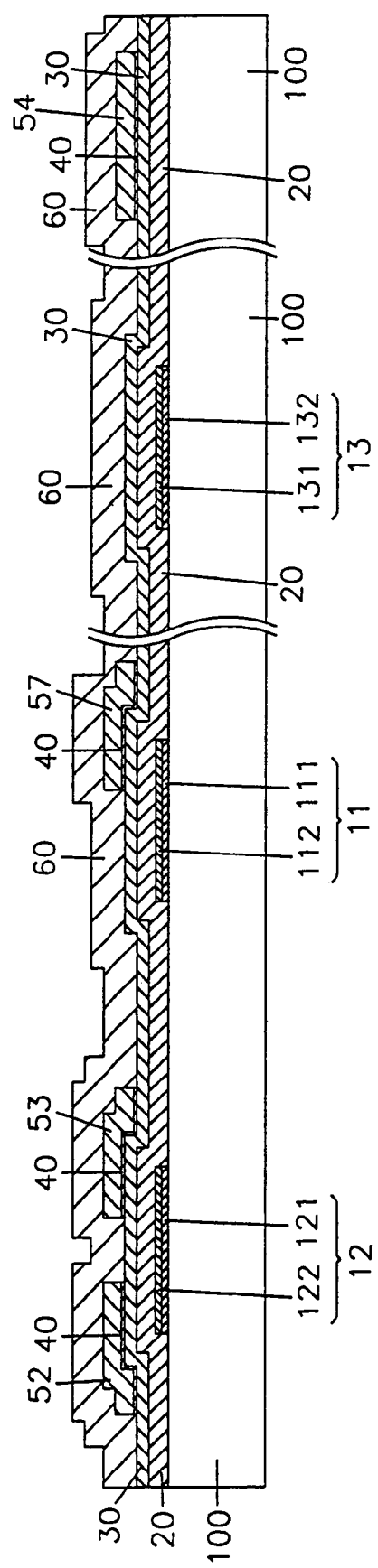

FIG. 17B, the metal layer 50 is patterned to form the data line 51, the source electrode 52, the drain electrode 53, the data pad 54 and a connection portion 57, using a second mask. The n+ amorphous silicon layer 40 is etched, using the patterned data line 51, the source electrode 52, the drain electrode 53, the data pad 54, and the connection portion as the mask. After that, the passivation film 60 is deposited.

Figure 17C:
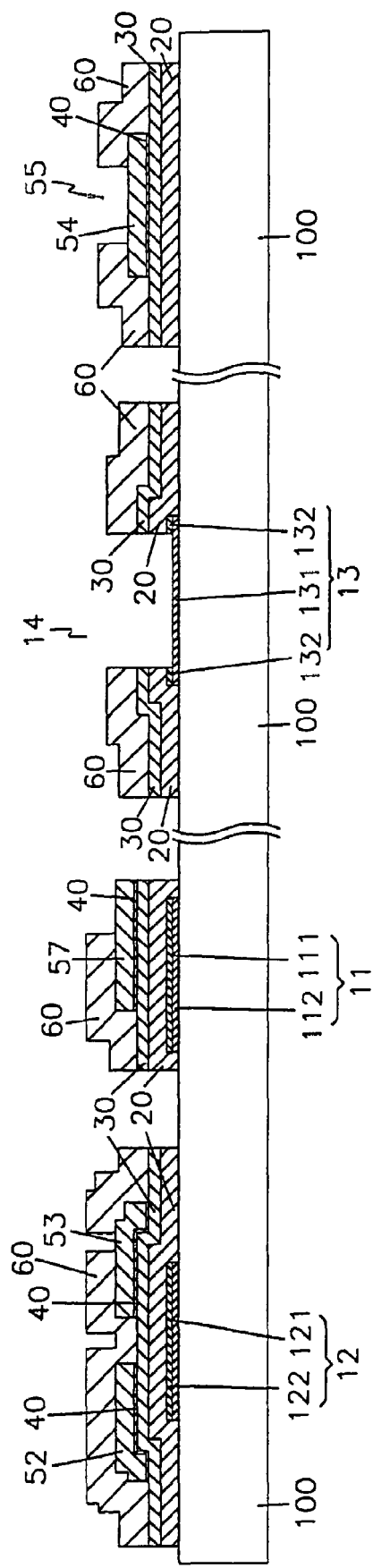

Referring to FIG. 17C, the passivation film 60 is patterned, using a third mask. Here, the passivation film 60 covers the gate line 11, the gate electrode 12, the gate pad 13, the data line 51, the source electrode 52, the drain electrode 53 and the data pad 54. The contact holes 14, 55 and 56 are formed on central portions of each pad 103 and 114 and the drain electrode 53, and an upper portion of a part of the connection portion 57 is removed. The amorphous silicon layer 30 and the gate insulating layer 20 are etched in sequence, using the patterned passivation film 60 as the mask. Here, the amorphous silicon layer 30 and the gate insulating layer 20 under the connection portion 57 are not etched. Next, the upper portion of the exposed gate pad 13 is etched by the contact hole 14.

Finally, the ITO film is deposited and patterned to form the pixel electrode 70, the gate ITO pad 71 and the data ITO pad 72, using a fourth mask, as illustrated in FIGS. 15, 16 and 12.

Figure 18:
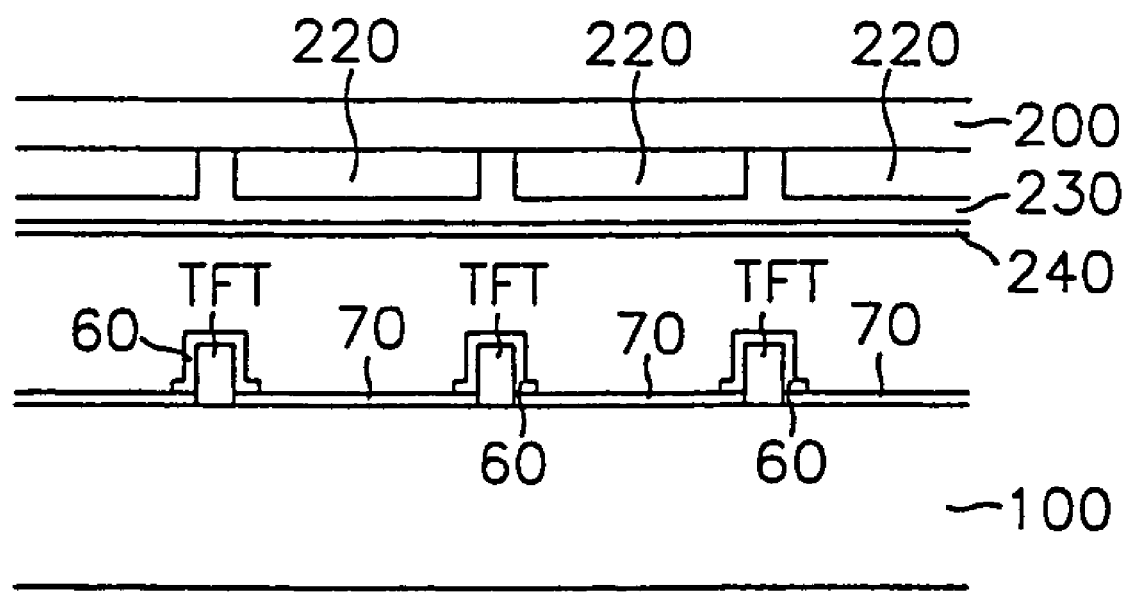
FIG. 18 is a cross-sectional view illustrating a liquid crystal display in accordance with a preferred embodiment of the present invention.

On the other hand, there is no need to form the light shielding film additionally on an upper substrate since the passivation film 60 also having the function of the light shielding film covers the border of the pixel and the TFT in the second and the third preferred embodiments of the present invention. That is, as illustrated in FIG. 18, a wiring (not shown), the pixel electrode 70, the TFT and the passivation film also having the function of the light shielding film are formed in a lower substrate 100. The light shielding film is not needed in the other substrate, and only a color filter 220, a common electrode 240, and an overcoat 230 are formed in the other substrate.

As described above, the effect of the present invention lies in that manufacturing cost can be reduced and the productivity is improved since the process is reduced to four steps by patterning the light shielding film and the passivation film, which have the same pattern each other, or the passivation film also having the function of the light shielding film, and etching the amorphous silicon layer using the patterned passivation film and the drain electrode exposed outside the passivation film or the connection portion as the mask.

Other embodiments of the invention will be apparent to the skilled in the art from consideration of the specification and practice of the invention disclosed herein. It is intended that the specification and examples be considered as exemplary only, with the true scope and spirit of the invention being indicated by the following claims.

What is claimed is:

1. A thin film transistor array panel used for a liquid crystal display, comprising:
   a substrate;
   a gate line formed on the substrate and extending in a first direction;
   a gate electrode coupled to the gate line;
   a gate insulating layer covering the gate line and the gate electrode;
   a semiconductor layer on the gate insulating layer;
   a doped semiconductor layer on the semiconductor layer;
   a data line formed on the doped semiconductor layer, extending in a second direction and intersecting the gate line;
   a source electrode coupled to the data line;
   a drain electrode facing the source electrode with a gap therebetween on the semiconductor;
   a passivation layer covering the data line and the source electrode and a part of the drain electrode; and
   a pixel electrode coupled to the drain electrode,
   wherein substantially the whole area of the data line is formed on the semiconductor layer and the doped semiconductor layer is formed only below the data line, the source electrode, and the drain electrode.

2. A thin film transistor array panel of claim 1, wherein substantially the whole area of the data line has the same dimensions and pattern as the semiconductor layer which is between the gate insulating layer and the data line.

3. A thin film transistor array panel of claim 1, wherein substantially the whole area of the source electrode is formed on the semiconductor layer.

4. A thin film transistor array panel of claim 3, wherein substantially the whole area of the source electrode has the same dimensions and pattern as the semiconductor layer which is between the gate insulating layer and the source electrode.

5. A thin film transistor array panel used for a liquid crystal display, comprising:
   a substrate;
   a gate line formed on the substrate and extending in a first direction;
   a gate electrode coupled to the gate line;
   a gate insulating layer covering the gate line and the gate electrode;
   a semiconductor layer on the gate insulating layer;
   a doped semiconductor layer on the semiconductor layer;
   a data line formed on the doped semiconductor layer, extending in a second direction and intersecting the gate line;
   a source electrode coupled to the data line;
   a drain electrode facing the source electrode with a gap therebetween on the semiconductor layer;
   a passivation layer covering the data line and the source electrode and part of the drain electrode; and
   a pixel electrode coupled to the drain electrode,
   wherein substantially the whole area of the data line is formed on the doped semiconductor layer and the doped semiconductor layer is formed only below the data line, the source electrode, and the drain electrode.

6. A thin film transistor array panel of claim 5, wherein substantially the whole area of the data line has the same dimensions and pattern as the doped semiconductor layer which is between the semiconductor layer and the data line.

7. A thin film transistor array panel of claim 5, further comprising a conductive portion between the semiconductor layer and the passivation layer covering the gate line, and wherein a part of the conductive portion extends beyond the passivation layer and is connected to the pixel electrode.

8. A thin film transistor array panel of claim 5, wherein substantially the whole area of the data line has the same dimensions and pattern as the semiconductor layer which is between the gate insulating layer and the data line.

9. A thin film transistor array panel of claim 5, wherein substantially the whole area of the source electrode has the same dimensions and pattern as the semiconductor layer which is between the gate insulating layer and the source electrode.

10. A thin film transistor array panel used for a liquid crystal display, comprising:
    a substrate;
    a gate line formed on the substrate and extending in a first direction;
    a gate electrode coupled to the gate line;
    a gate insulating layer covering the gate line and the gate electrode;
    a semiconductor layer on the gate insulating layer;
    a doped semiconductor layer on the semiconductor layer;
    a data line formed on the doped semiconductor layer, extending in a second direction and crossing over the gate line;
    a source electrode electrically coupled to the data line;
    a drain electrode facing the source electrode with a gap therebetween;
    a passivation layer covering the data line and the source electrode and a part of the drain electrode; and
    a pixel electrode electrically coupled to the drain electrode,
    wherein substantially the whole area of the data line is formed on the semiconductor layer and the doped semiconductor layer is formed only below the data line, the source electrode, and the drain electrode.

11. A thin film transistor array panel of claim 10, wherein substantially the whole area of the data line has the same dimensions and pattern as the semiconductor layer which is between the gate insulating layer and the data line.

12. A thin film transistor array panel of claim 10, wherein substantially the whole area of the source electrode is formed on the semiconductor layer.

13. A thin film transistor array panel of claim 12, wherein substantially the whole area of the source electrode has the same dimensions and pattern as the semiconductor layer which is between the gate insulating layer and the source electrode.

14. A thin film transistor array panel of claim 10, further comprising a conductive portion between the semiconductor layer and the passivation layer overlapping a portion of the gate line, and wherein a part of the conductive portion extends beyond the passivation layer and is connected to the pixel electrode.

* * * * *